(12) United States Patent
Franosch et al.

(10) Patent No.: US 6,939,734 B2
(45) Date of Patent: Sep. 6, 2005

(54) METHOD FOR PRODUCING A PROTECTIVE COVER FOR A DEVICE

(75) Inventors: Martin Franosch, Munich (DE); Andreas Meckes, München (DE); Klaus-Günter Oppermann, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/820,652

(22) Filed: Apr. 8, 2004

(65) Prior Publication Data

US 2005/0009316 A1 Jan. 13, 2005

(30) Foreign Application Priority Data

Apr. 11, 2003 (DE) .......................................... 103 16 776

(51) Int. Cl.[7] .............................................. H01L 21/00
(52) U.S. Cl. ......................................... 438/53; 438/619
(58) Field of Search ............................. 438/51, 52, 53, 438/422, 460, 465, 619

(56) References Cited

U.S. PATENT DOCUMENTS

| 5,510,276 A | 4/1996 | Diem et al. |
| 5,912,499 A | 6/1999 | Diem et al. |
| 6,030,515 A | 2/2000 | Heyers et al. |
| 6,211,558 B1 * | 4/2001 | Ismail et al. ................. 257/419 |
| 6,358,861 B1 * | 3/2002 | Ohji et al. ................... 438/746 |
| 6,451,668 B1 * | 9/2002 | Neumeier et al. ........... 438/401 |
| 6,534,340 B1 * | 3/2003 | Karpman et al. ............ 438/113 |

FOREIGN PATENT DOCUMENTS

| DE | 693 18 957 T2 | 12/1998 |
| DE | 197 32 250 A1 | 1/1999 |
| DE | 102 00 869 A1 | 7/2003 |
| EP | 0 373 360 B1 | 11/1989 |
| WO | WO 2003/057618 A3 | 7/2003 |

* cited by examiner

Primary Examiner—Chandra Chaudhari
(74) Attorney, Agent, or Firm—Maginot, Moore & Beck

(57) ABSTRACT

In a method for producing a protective cover for a device which is formed in a substrate, a first cover layer is initially deposited on the substrate, the first cover layer covering an area of the substrate which includes the device. Subsequently, an opening is formed in the first cover layer, the opening exposing that area of the substrate which includes the device. Then the opening formed in the first cover layer is filled up using a filling material. Subsequently, a second cover layer is deposited on the first cover layer and in the opening of the first cover layer which is filled up with the filling material. Thereafter, an opening is formed in the second cover layer to expose an area of the filling material. Finally, the filling material covering that area of the substrate which includes the device is removed, and the opening formed in the second cover layer is closed.

20 Claims, 12 Drawing Sheets

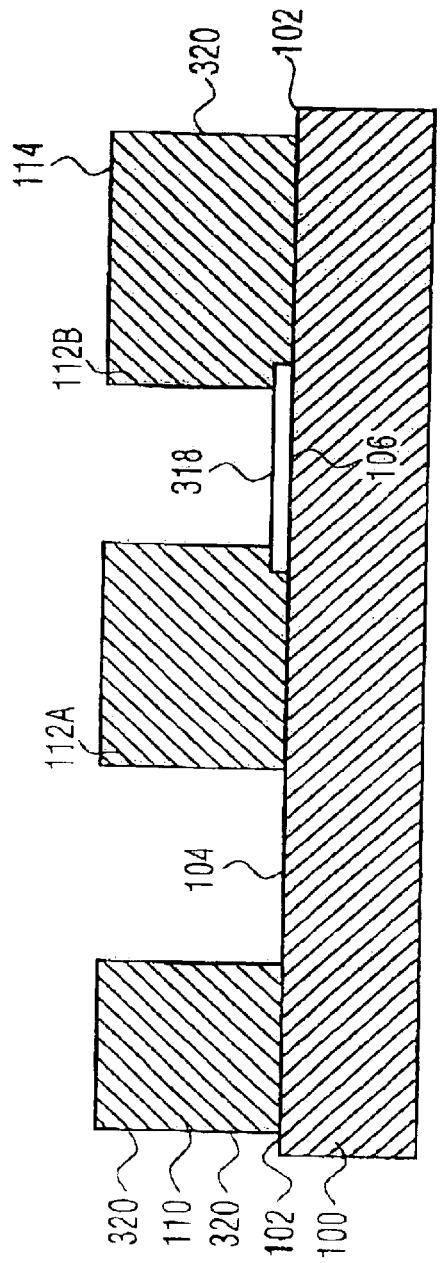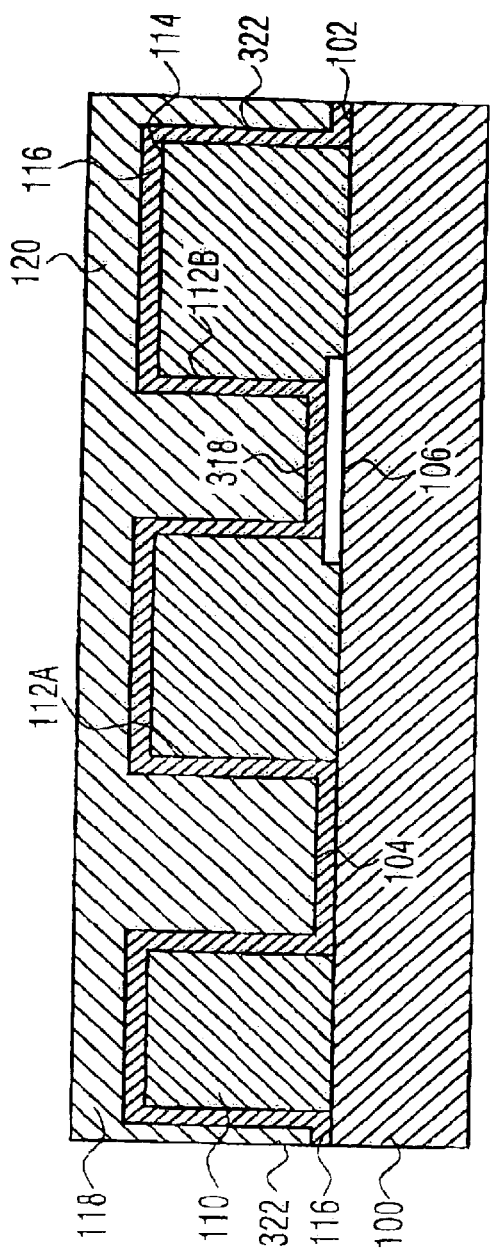

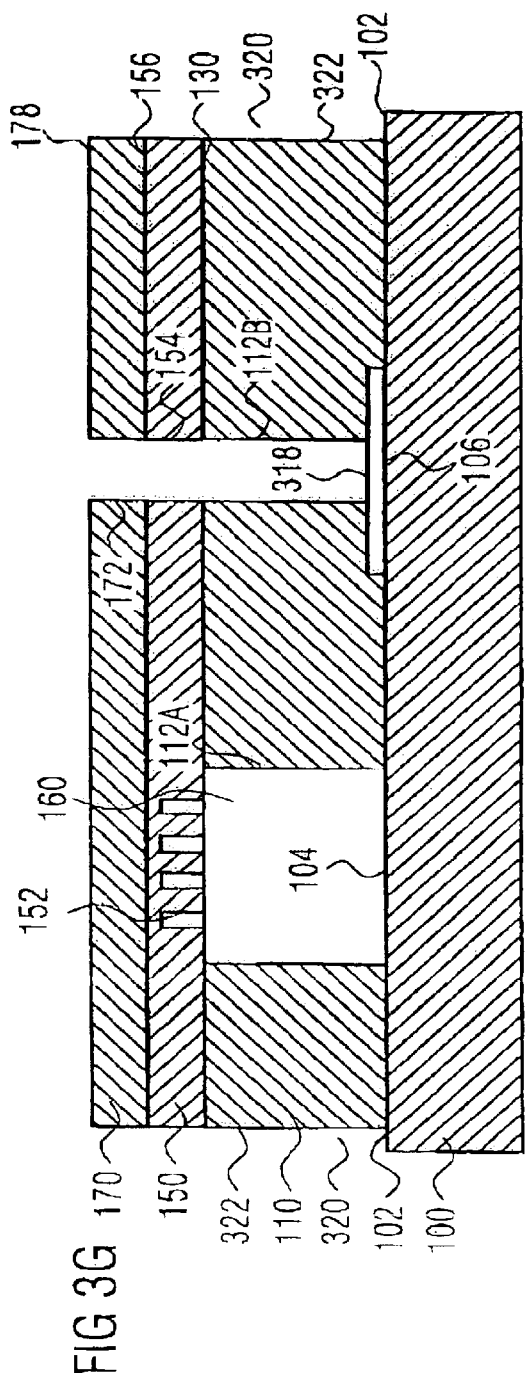
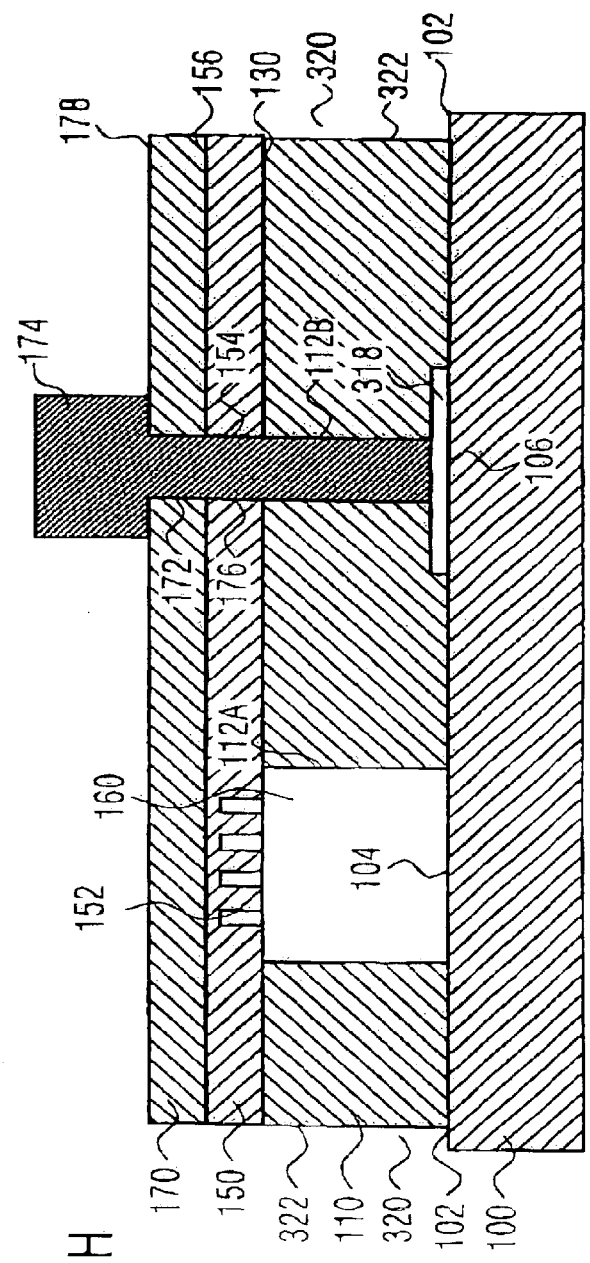
FIG 3G
FIG 3H

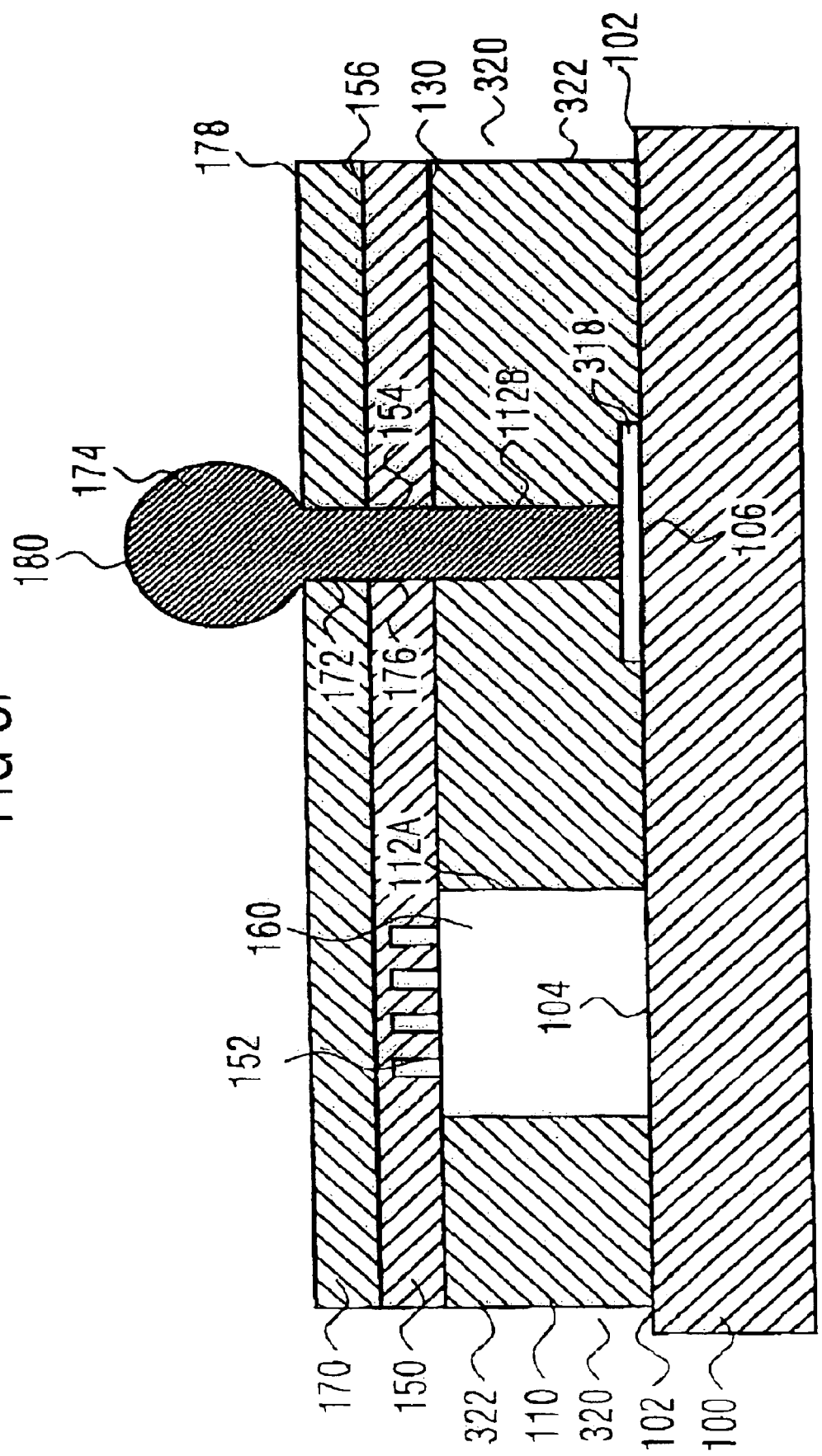

METHOD FOR PRODUCING A PROTECTIVE COVER FOR A DEVICE

BACKGROUND OF THE INVENTION

1. Field of the Invention

The present invention relates to a method for producing a protective cover for a device, and in particular to the production of a protective cover for devices containing areas whose function would be impeded by injection-molding housings, such as BAW filters (BAW=bulk acoustic wave), SAW filters (SAW=surface acoustic wave), resonators, sensors, and/or actors. In particular, the present invention relates to a method for producing such a protective cover for the devices on wafer level.

2. Description of Prior Art

Conventionally, devices are produced on and/or in a substrate, wherein after completion of the device the substrate including the device is arranged in an injection-molding housing in a protected manner. In this arrangement, the substrate and the device are completely embedded in the material of the injection-molding housing at least in the area of the device. This procedure is disadvantageous for devices whose function is impeded by this material which, thus require a clearance for proper operability, as is required, for example, in the above-mentioned BAW filters, SAW filters, resonators, sensors, and actors.

An approach known in the prior art to solve these problems with injection-molding housings is to provide a "counter-substrate" in which a corresponding opening is inserted, so that when assembling the device substrate and the housing substrate the cavity is arranged in the area of the device in the device substrate, so that here no further impeding of the device occurs. On wafer level, a wafer is correspondingly produced with a corresponding structure for the devices (system wafer) which is connected to a second wafer (lid wafer) having corresponding pits and holes having been produced for example by etching it, e.g. by a bond procedure. In this manner, the pits of the second wafer become cavities above the sensitive structures of the first wafer, the contact pads of the first wafer being accessible through the holes in the second wafer. Hereby, the sensitive structures are protected.

Alternatively to the procedures just described, a ceramic housing may also be used.

The disadvantage of this solution is that here always a second substrate or a second wafer is to be structured, which requires processing and machining separate from the first wafer. This leads to very time-consuming and expensive overall production and also increases the requirements with respect to the required process accuracy. A further disadvantage of the procedure is that in the connection of the lid wafer to the system wafer pressure and temperature have additionally to be applied, and that the requirements on the surface quality and purity are correspondingly high. A further, even more serious disadvantage is that during this bond process the micro-electromechanical structures are already exposed so that here an additional yield risk exists.

In the post-published German patent application DE 102 00 869 A, an alternative method is described, which describes a sacrificial layer and a cover element formed by a photoresist. The sacrificial layer is formed in an area of the substrate in which the device is formed, in which the cavity is to be produced later. Over the sacrificial layer, a photoresist layer is deposited in which holes are inserted to expose the sacrificial layer in the area of the holes. Then the sacrificial layer is removed by suitable measures, and the holes in the photoresist layer are closed. The disadvantage of this procedure is to be seen in the creation of a non-uniform height profile across the wafer cross-section, i.e. of a non-planar wafer surface, which results from processing the individual protective covers above the devices. This non-uniform height profile across the wafer cross-section makes subsequent process steps more difficult. This applies, in particular, to methods exhibiting particularly good properties on planar surfaces, such as printing processes. Since low-cost printing methods, e.g. screen printing, are often used for applying contact pads in semi-conductor production, the occurrence of a non-uniform height profile across the wafer surface may entail a significant loss in precision in applying contact pads by means of the printing process, it being possible, under certain circumstances, for the low-cost printing processes to no longer have sufficient precision at a high packing density. Another disadvantage of a non-uniform height profile across the wafer cross-section are yield losses, since part of the protective covers to be formed on the wafer are "squashed" due of the printing processes employed. Finally it shall also be noted that due to self-supporting sacrificial structures and self-supporting protective covers on the wafer surface, as are provided in the post-published patent application DE 102 00 869 A, it is not possible to fall short of a defined component size, since otherwise the adherence of the sacrificial structure or of the protective cover to the wafer surface is too small, and the protective cover produced thus does not have sufficient stability.

EP 0 373 360 B1 describes a method for producing an improved insulation in VLSO and ULSI circuits, wherein here also a cavity is to be formed. Here the cavity is also structured by a sacrificial layer removed through one or more openings in a surface of the arrangement. However, a disadvantage to be noted here is that the cavity to be formed has little stability, since the cavity is formed essentially by a cover layer supported by the conductor lines to be insulated. For reasons of sufficient insulation, it is not possible to fall short of a defined cavity size, which, in turn, leads to yield losses due to a "squashing" of the cavities formed when using printing processes in subsequent process steps.

SUMMARY OF THE INVENTION

Starting from this prior art, it is the object of the present invention to provide a simplified and reliable method for producing a protective cover for devices, which enables the production of a stable and small-size protective cover in a simple and cost-efficient manner without requiring separate processing of further wafers and/or substrates.

The present invention provides a method for producing a protective cover for a device, wherein a substrate is provided that includes the device, the method including the following steps:

(a) depositing a first cover layer on a substrate, the first cover layer covering at least an area of the substrate which includes the device;

(b) forming at least one opening in the first cover layer, the at least one opening exposing the area of the substrate which includes the device;

(c) filling up the opening formed in the first cover layer using a filling material;

(d) depositing a second cover layer on the first cover layer and on the opening of the first cover layer which is filled up with the filling material;

(e) forming at least one opening in the second cover layer to expose at least an area of the filling material;

(f) removing the filling material which covers an area of the substrate which includes the device; and (g) closing the opening formed in the second cover layer.

The invention is based on the finding that a stable and small-size protective cover may be formed by depositing, on a substrate, a first cover layer covering at least an area of the substrate which includes the device. Subsequently, an opening in the first cover layer is formed above that area of the substrate which includes the device, and the opening formed in the first cover layer is filled up with a filling material. Here, the filling-up of the openings formed in the first cover layer is effected such that no filling material is applied on the first cover layer, and that, at the same time, a planar surface area consisting of areas of the filling material and of the first cover layer is created by filling up the openings in the first cover layer. Subsequently, a second cover layer is deposited on the planar surface area formed, in which second cover layer at least one opening is formed to expose at least an area of the filling material. It is through this at least one opening formed that that filling material is removed for forming a cavity which covers an area of the substrate which includes the device. Subsequently, the at least one opening formed in the cover layer is closed.

An advantage of the inventive approach is that the first cover layer, through whose opening the cavity to be formed is defined, remains on the substrate surface. Hereby, a planar surface area is formed after closing the opening formed in the first cover layer, which planar surface area significantly simplifies the further process steps of creating a protective cover of a device. The simplification results, in particular, from the fact that the formation of a non-uniform height profile across the wafer cross-section is avoided due to the first cover layer remaining on the substrate surface. This enables, in a subsequent process step, in particular, the precise utilization of low-cost printing processes for applying a metal paste required for contacting the devices.

A further advantage of the inventive approach is also that the formation of self-supporting sacrificial structures is avoided due to the first cover layer remaining on the wafer surface. Due to the fact the cavity-defined structures now are enclosed by the first cover layer, the increased stability of the cavity-deformed structures achieved hereby enables smaller cavities and thus a higher packing density on a wafer to be realized.

A further advantage of the inventive approach is that by embedding the cavities in the first cover layer and due to the first cover layer remaining on the substrate surface, a structure is created by which the cavity formed is protected as much as possible in subsequent process steps, and by which the yield losses occurring in the creation of the protective cover for a device are thus minimized. This applies, in particular, also due to the fact that sacrificial structures which are self-supporting in the inventive approach are avoided, and that, when applying a printing process in the process of manufacturing the protective cover, "squashing" of the latter is thus avoided.

In accordance with a preferred embodiment of the present invention, the formation of at least one opening in the first and/or second cover layers includes exposing the first and/or second cover layers to light, followed by developing the areas exposed to light of the first and/or second cover layers for forming the opening described.

In accordance with a further preferred embodiment of the present invention, filling up the opening formed in the first cover layer includes applying a filling material on the first cover layer and in the at least one opening of the first cover layer, followed by planarizing the structure resulting from the application of the filling material such that the first cover layer and the filling material are exposed in the at least one filled-up opening of the first cover layer.

In accordance with a further preferred embodiment, a further opening is formed in the first cover layer to expose an area of the substrate with a contact area of the device. The further opening in the first cover layer is subsequently filled up with a conductive filling material, a conductive layer being subsequently deposited, which layer is in an electrically conductive connection with the conductive filling material in the further opening and covers same. In addition, a further opening is formed in the second cover layer to expose the conductive layer described. Moreover, filling up the further opening in the second cover layer is dispensed with.

In accordance with a further preferred embodiment of the present invention, a conductive material is introduced into the further opening of the second cover layer to route the contact area of the device across the conductive filling material, the conductive layer and the conductive material to an external contact pad.

In accordance with a further preferred embodiment, the substrate comprises, in addition to a device area, a contact area of a device, a conductive layer which covers the contact area being applied on the substrate in a first step. Once a first cover layer has been deposited on the conductive layer, at least one further opening is formed in the First cover layer adjacent to the cavity-defining opening in the first cover layer so as to expose the conductive layer applied. In addition, the further opening formed is filled up with a filling material, and a second cover layer is deposited on the first cover layer and in the further opening of the first cover layer, which further opening is filled up with the filling material. Subsequently, a further opening is formed in the second cover layer adjacent to an opening for exposing the filling material covering the device area, so as to expose the filling material in the further opening formed in the first cover layer and so as to remove, in a further process step, this filling material from the further opening in the first cover layer. For this embodiment of the present invention, filling-up the further opening in the second cover layer is, again, dispensed with.

In accordance with a further preferred embodiment, a conductive material is introduced into the non-filled up further openings of the first and second cover layers so as to route the contact area of the device to an external contact pad across the conductive layer and the conductive material.

In accordance with a further preferred embodiment, the external contact pad is formed by applying a metal paste in a structured manner.

In accordance with a further preferred embodiment, the device includes a BAW filter, an SAW filter, a resonator, a sensor or an actor.

In accordance with a further preferred embodiment of the present invention, the inventive method is applied on wafer level so as to enable, in a simple manner, the creation of a protective layer in accordance with the inventive method for a multiplicity of devices formed in the wafer.

In accordance with a further preferred embodiment, the wafer is broken up into several individual components after processing.

In accordance with a further preferred embodiment, the structuring of the first and second cover layers includes specifying dicing lines on the wafer.

BRIEF DESCRIPTION OF THE DRAWINGS

Preferred embodiments of the present invention will be explained below in more detail with reference to the accompanying figures, wherein:

FIGS. 3A–3I show the steps of the inventive method of producing a protective cover of a device in a sectional illustration in accordance with a second preferred embodiment.

DESCRIPTION OF PREFERRED EMBODIMENTS

Figure 1A:
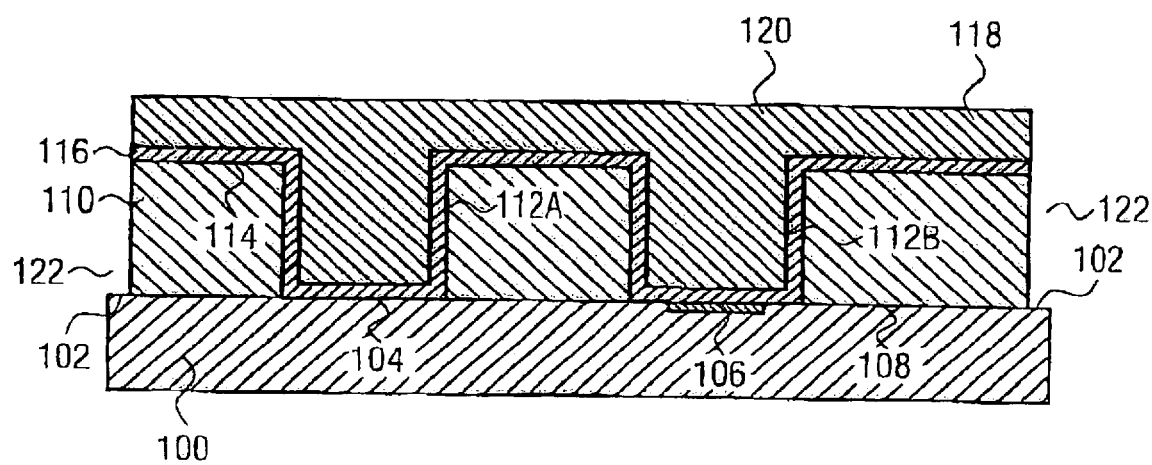
FIGS. 1A–1I show the steps of the inventive method of producing a protective cover of a device in a sectional illustration in accordance with a first preferred embodiment.

In the subsequent description of the preferred embodiments of the present invention, like reference numerals are used for like elements illustrated in the various drawings.

On the basis of FIGS. 1A–1I, the inventive method of producing a protective cover of a device in accordance with a first preferred embodiment will be explained below in more detail. FIG. 1A shows a substrate 100 comprising a first surface 102, substrate 100 including a first area 104 in which a device is formed (=device area), a second area 106, in which a contact area of a device is formed (=contact area), and a third area 108 in which no contact area of a device and no device is formed. The device formed in device area 104 is, for example, a device which includes at least one area whose function would be impeded by a housing, i.e. whose function requires a clearance above the device area 104 in question. In this respect it is to be pointed out that in the figures, area 104 is indicated as the device area in an abstract manner, wherein here, however, reference is made in fact to that area of a device formed in substrate 100 whose functionality requires a clearance or cavity. The elements concerned may be, for example, BAW filters, SAW filters, resonators, sensors or actors. Likewise, surface-micromechanical sensors may be formed, whose function would be impeded by the housing, such as acceleration sensors, rotation rate sensors, and the like.

In accordance with the invention, as is illustrated in FIG. 1A, a first cover layer 110 is initially deposited on the surface 102 of substrate 100, the first cover layer 110 covering the device area 104 and the contact area 106. The material used for the first cover layer 110 may be, for example, a photo-structurable resist (for example SU-8 of Microchem, USA). In a subsequent process step, the first cover layer 110 is structured, for example by exposing to light using a mask and by developing the locations exposed, such that only the device area 104 to be protected, the contact area 106 through an opening 112a and 112b, respectively, in the first cover layer 110, and edge regions 122 of substrate 100 are exposed. Once the opening 112a for exposing a device area 104, and the opening 112b for exposing a contact area 106 have been formed in the first cover layer 110, a seed layer 116 (=electrodeposition starting layer) is applied onto the surface 114 of the first cover layer, to the side walls of the openings 112a and 112b, to the device area 104 and to the contact area 106, use being preferably made of a conductive material, in particular a metallic material. The application of the seed layer 116 may be effected, for example, by sputtering, vapor deposition or autocatalytic growth. Subsequently, a filling material 118 is applied onto the seed layer 116 such that the openings 112a and 112b in the first cover layer 110 are filled up, and the seed layer 116 is fully covered. The application of the filling material 118 may be implemented, for example, by reinforcing the seed layer 116 with copper (=copper electrodeposition, copper plating).

Figure 1B:
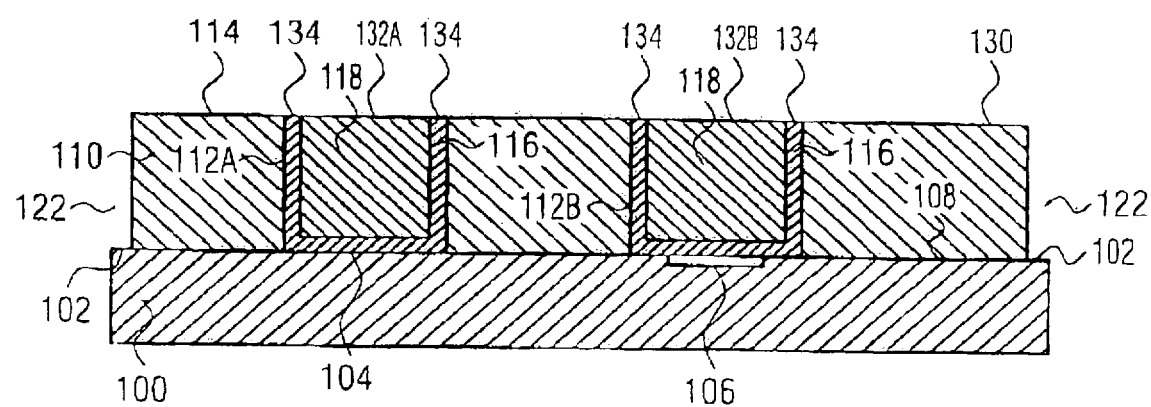

Subsequently, the surface 120 of the filling material 118, which results from the previous process steps, is planarized such that a planar surface area 130 opposing the substrate 100 is created (see FIG. 1B), which includes areas of the surface 114 of the first cover layer 110, areas of the surface 132a of the filled-up opening 112a in the first cover layer 110 above the device area 104, areas of the surface 132b of the filled-up opening 112b in the first cover layer 110 over the contact area 106, and areas of the plane of section 134 of the seed layer 116, the transitions between the individual areas being aligned in a flush manner. Here, the planarization may be effected by a CMP step (CMP=chemical mechanical polishing). FIG. 1B shows the resulting structure in a sectional illustration.

Figure 1C:
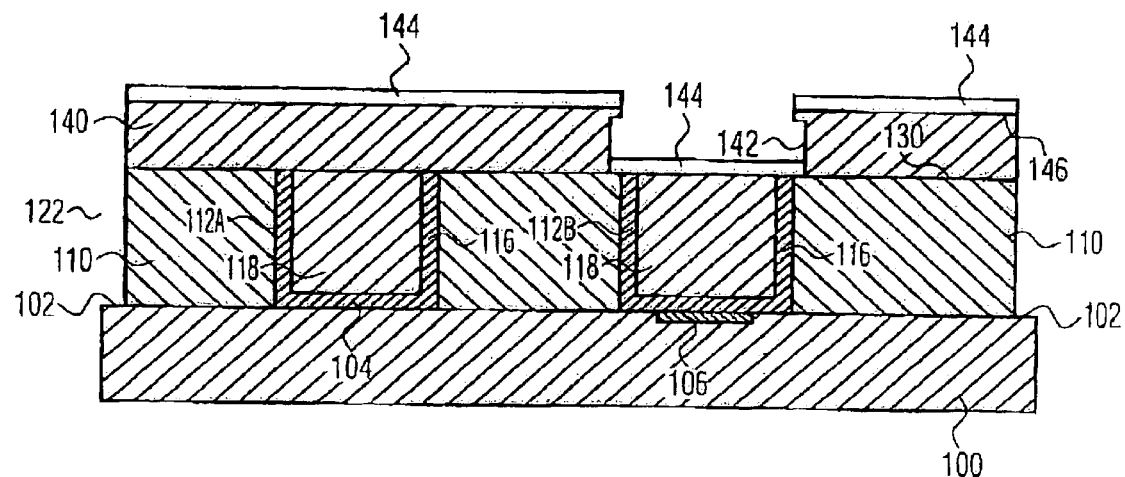
Figure 1D:
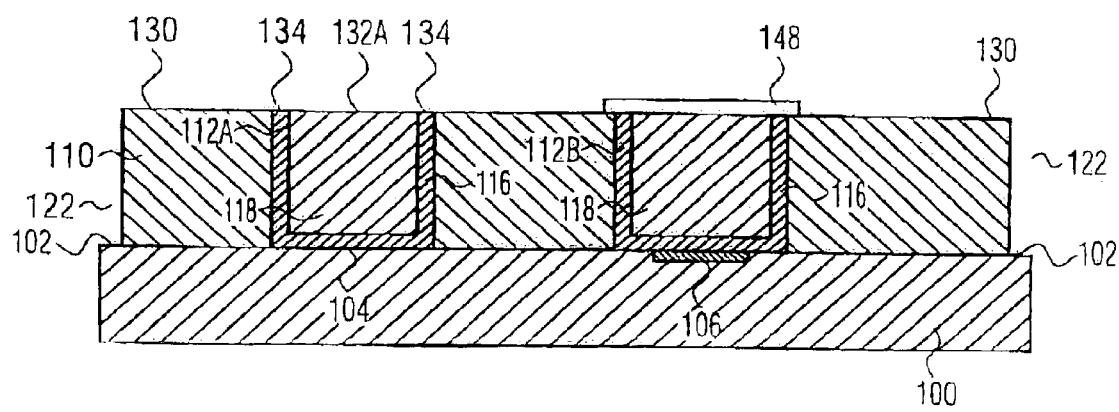

As is illustrated in FIG. 1C, an additional cover layer 140 is subsequently applied to the planar surface area 130 thus obtained, which cover layer 140 consists, for example, of a photo-structurable resist which, however, preferably differs from the material of the first cover layer 110. The additional cover layer 140 is subsequently structured such that the surface 132b of the filled-up opening 112b in the first cover layer 110 above the contact area 106 of the device as well as adjacent areas of the plane of section 134 of the seed layer 116 and corresponding portions of the surface 132 are exposed through an opening 142 in the additional cover layer 140. The formation of the opening 142 in the additional cover layer 140 may be effected here, for example, by exposing the additional cover layer 140 to light using a photomask, and by subsequently developing the areas exposed to light of the additional cover layer 140. However, it is to be noted here that when developing the exposed location of the additional cover layer 140, the integrity of the first cover layer 110 is ensured. After structuring the additional cover layer 140 while forming the opening 142 in the additional cover layer 140, a conductive layer 144 is deposited onto the surface 146 of the additional cover layer 140 and onto the area exposed through opening 142. Subsequently, the additional cover layer 140 and the conductive layer 144 applied thereon are removed, so that only that portion 148 of the conductive layer 144 remains in the opening 142. FIG. 1D shows the structure resulting therefrom. Hereby, the filling material 118 in the opening 112b of the first cover layer 110 above the contact area 106 of the device may be conductively sealed such that in subsequent steps, a removal of the filling material 118 and of the seed layer 116 in the opening 112b of the first cover layer 110 over the contact area 106 of the device is prevented. Here, the remaining conductive layer 144 preferably exhibits a resistance towards a substance for removing the filling material 118 and the seed layer 116. A material that may be useful for this purpose is gold, for example. In addition it is to be noted that the removal of the additional cover layer 140 does not damage the planar surface area 130. In this respect, a suitable choice of the material of the additional cover layer 140 and of a relevant solvent is to be borne in mind.

Figure 1E:
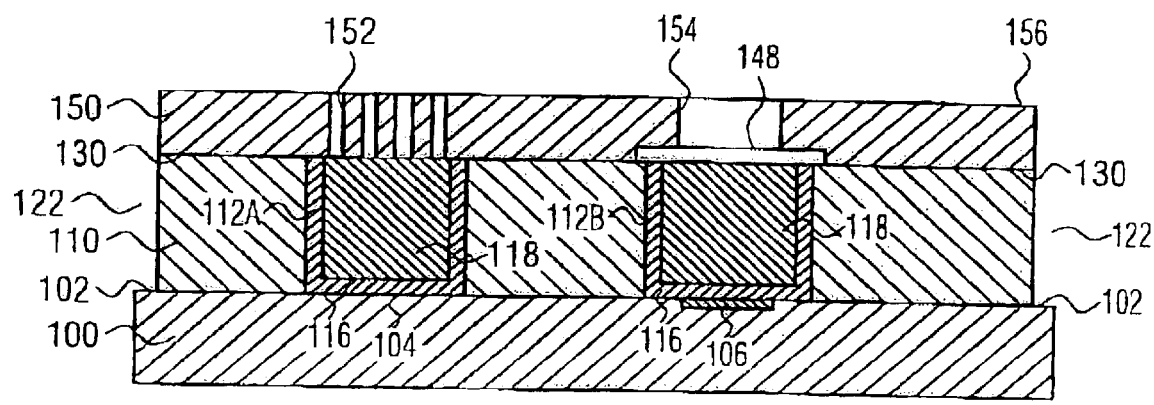

In a subsequent process step, a second cover layer 150 is deposited onto the surface area 130 and onto the remaining conductive layer 148, as is shown in FIG. 1E. The material used for the second cover layer 150 may be, for example, another photo-structurable resist (e.g. SU-8 of Microchem, USA). Subsequently, the second cover layer 150 is structured, for example by exposing to light and developing the exposed locations, such that at least one opening, four openings in the embodiment shown, 152 in the second cover layer 150 exposes an area of the filling material 118 which fills up the opening 112a of the first cover layer 110 above the device area 104. In addition, the structuring leads to the formation of another opening 154 in the second cover layer 150 so as to expose an area of the remaining conductive layer 148.

Once the openings 152 and the opening 154 have been formed in the second cover layer 150, the filling material 118 and the seed layer 116 are removed, for example by an etching process, through openings 152 of the second cover layer 150. Thereby a cavity 160 is formed above the device area 104, which cavity 160 is required for the fault-free operation of the device. By sealing the filling material 118 and the seed layer 116 above the contact area 106 with the remaining conductive layer 148 a removal of the filling material 118 and the seed layer 116 above the contact area 106 by the etching process mentioned above is prevented. The resulting structure is shown in FIG. 1F.

Figure 1F:
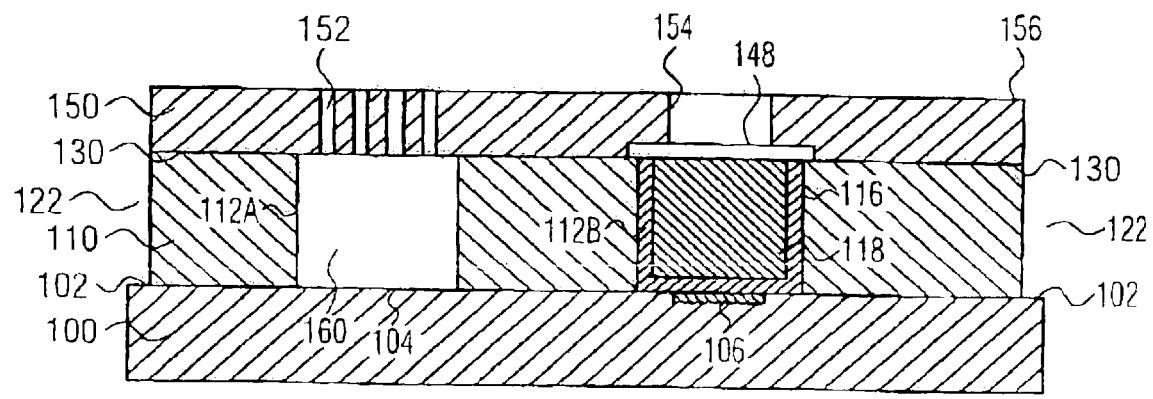
Figure 1G:
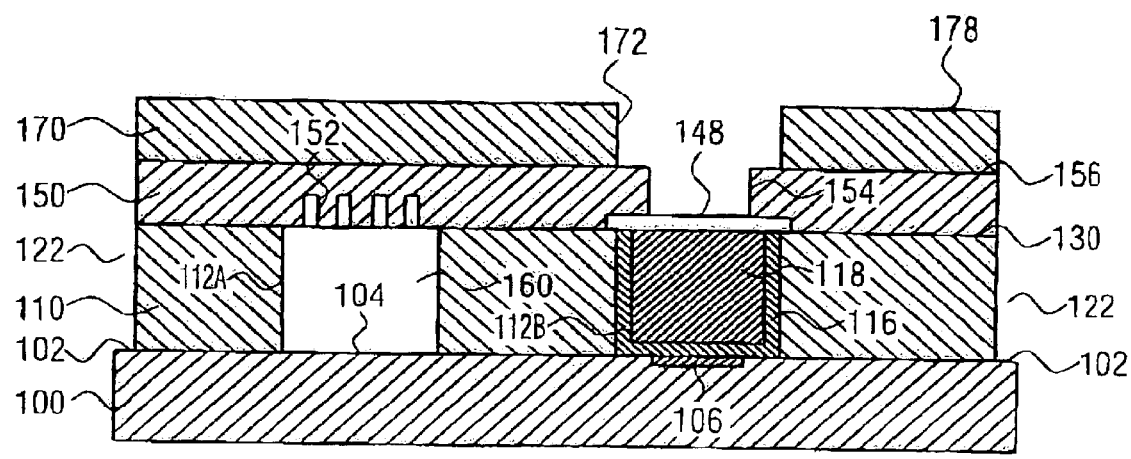

Then cavity 160 is closed in a further process step, wherein, as is shown in FIG. 1G, a third cover layer 170 is deposited onto the structure as results following FIG. 1F, whereby the openings 152 are closed without filling up the cavity 160 formed. A material that may be used for the third cover layer 170 may be, again, a photo-structurable resist (e.g. SU-8). In addition, the third cover layer 170 is structured, e.g. by exposing to light and by developing the exposed locations, such that an opening 172 is formed in the third cover layer 170, which opening exposes the remaining conductive layer 148 using the opening 154 in the second cover layer 150, so that the step-shaped structure represented results.

Figure 1H:
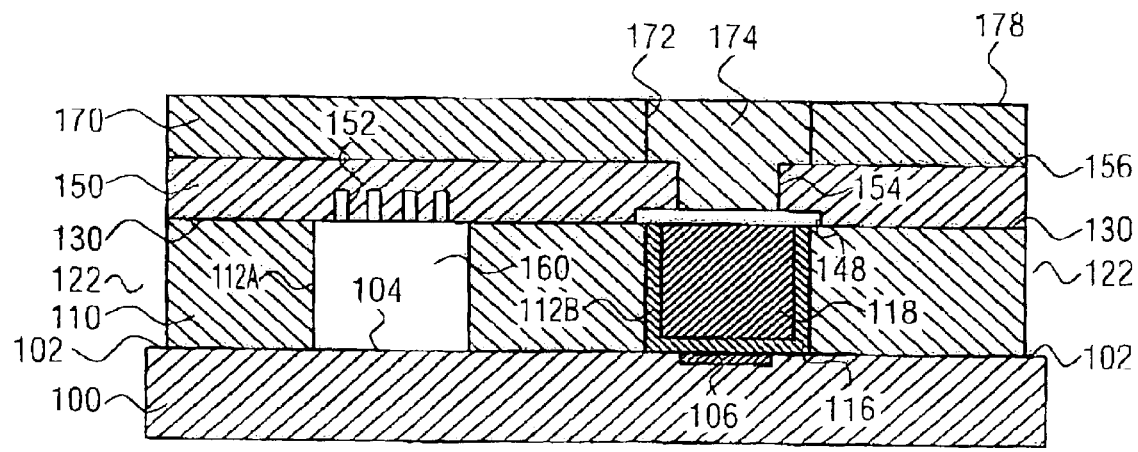

In a final process step, the remaining conductive layer 148 is contacted through the opening 154 of the second cover layer 150 and the opening 172 of the third cover layer 170, for example by filling up the openings 154 and 172 mentioned in a conductive manner with a metal paste 174 by means of a printing process, as is shown in FIG. 1H.

Figure 1I:
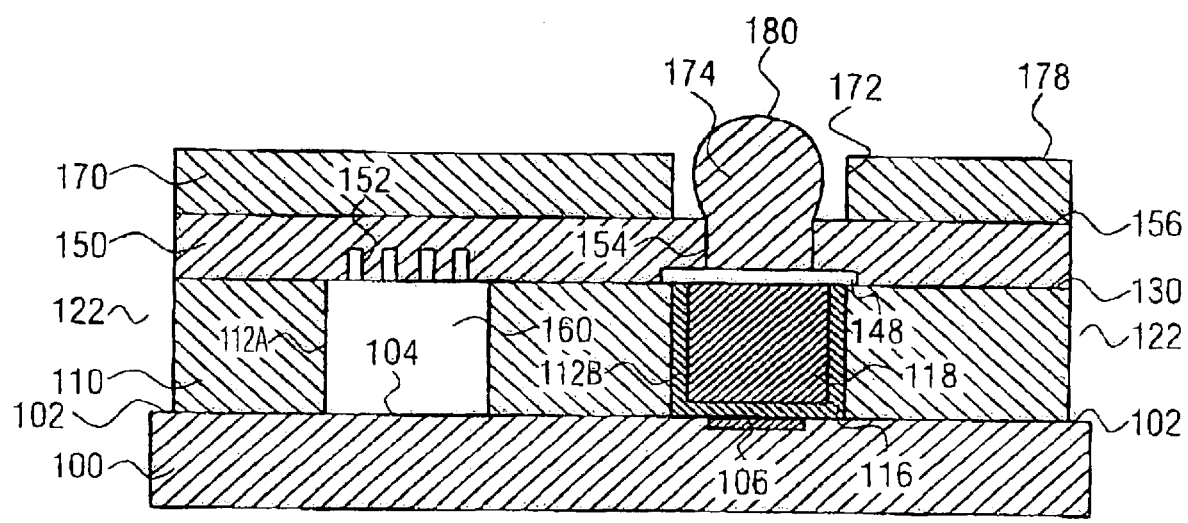
Figure 2A:
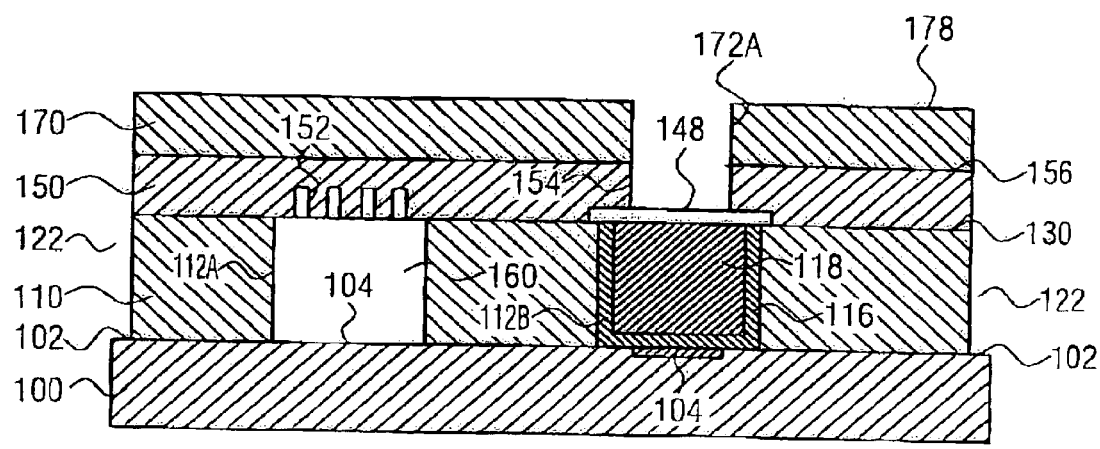
FIGS. 2A–2D show the steps of the inventive method of producing a protective cover of a device in a sectional illustration in accordance with a variant of the first preferred embodiment.
Figure 2B:
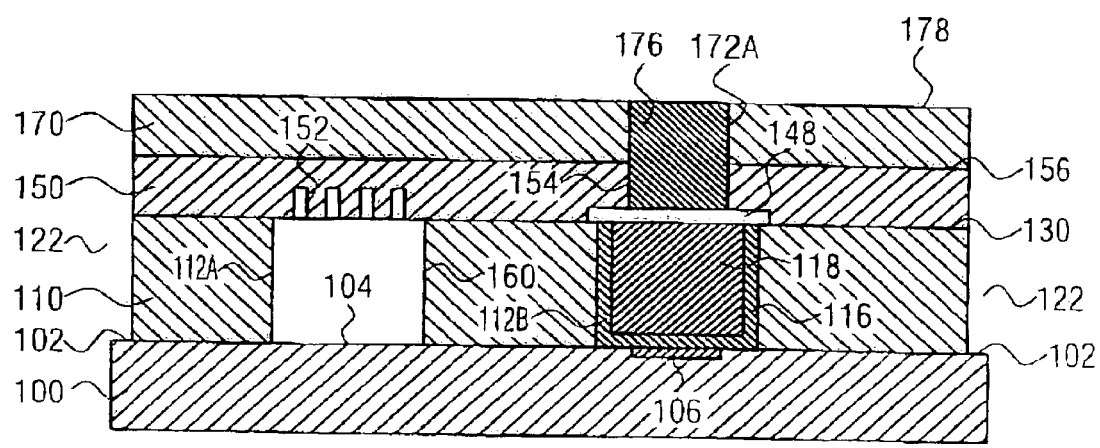
Figure 2C:
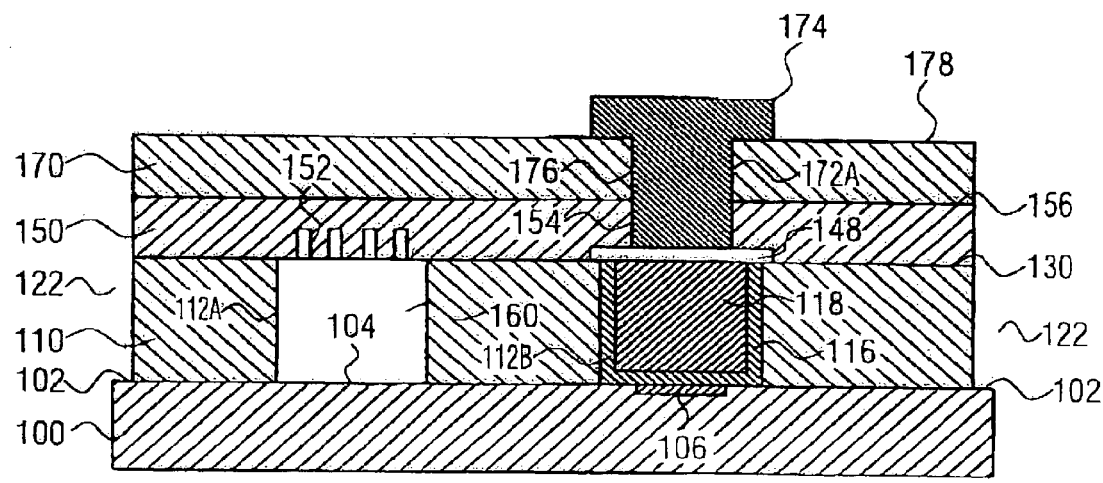
Figure 2D:
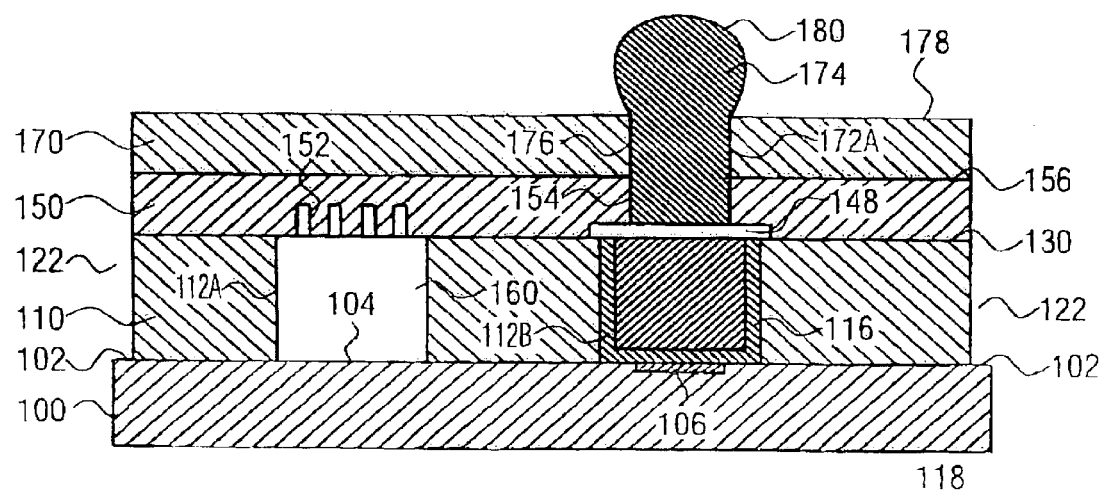

FIG. 1I shows the external contacts resulting from the filled-up metal paste 174 after a reflow process, which contacts may be implemented, for example, as solder bumps 180.

FIG. 2 shows a variant of the first preferred embodiment of the invention, wherein the steps represented in FIGS. 1A–1G are identical. Hereby, however, the step-shaped structure of the openings 172 and 154 is avoided. Instead, an opening 172a is formed which is essentially aligned with the opening 154 of the second cover layer 150. The structure produced hereby is shown in FIG. 2A. In a subsequent process step, the opening 172a in the third cover layer 170, and the opening 154 in the second cover layer 150, are filled up with a conductive filling material 176 such that a contacting of the remaining conductive layer 148 on the surface 178 of the third cover layer 170 is possible. Here, the application of the conductive filling material 176 is preferably effected by electrodeposition. The structure resulting from this process step is shown in FIG. 2B. By means of a printing process, for example a screen-printing method, it is possible to apply, subsequently, a metal paste 174 to the conductive filling material 176, as is shown in FIG. 2C. By means of a subsequent reflow process, at least one solder bump 180 is produced from the applied metal paste 174 for externally contacting the contact area 106 from the surface 178 of the third cover layer 170. The structure resulting from this process step is shown in FIG. 2D.

FIG. 3 shows a second preferred embodiment of the present invention. As is shown in FIG. 3A, here an initial cover layer 310 is at first deposited on a substrate 100. A material that may be used for the initial cover layer 310 is a photo-structurable resist. In a subsequent process step, the initial cover layer 310 is structured, for example by exposing to light using a photomask and by subsequently developing the exposed layer, such that a contact area 106 of substrate 100 is exposed by through an opening 312 in the initial cover layer 310. Subsequently, a conductive layer 314 is applied onto the surface 316 of the initial cover layer 310 and on the contact area 106 of substrate 100, which contact area 106 is exposed through the opening 312 in the initial cover layer 310. A material that may be used for the conductive layer 314 is gold, for example. Removing the initial cover layer 310, which involves simultaneously removing the conductive layer 314 which has been applied to the surface 316 of the initial cover layer 310 results in the structure shown in FIG. 3S, wherein the remaining conductive layer 318 covers a contact area 106 of substrate 100.

Once the initial cover layer 310 has been removed, the first cover layer 110 is applied onto the surface 102 of substrate 100 and the remaining conductive layer 318, by analogy with the first preferred embodiment of the invention. Structuring the first cover layer 110 forms the opening 112a in the first cover layer 110, which exposes the device area 104. In addition, the structuring forms the opening 112b in the first cover layer 110, which opening exposes an area of the remaining conductive layer 318. In addition, the edge regions 320 of the substrate 100 are exposed. The structure resulting from this process step is shown in FIG. 3C.

In a subsequent process step, the seed layer 116 is deposited on the surface 114 of the first cover layer 110, onto the sidewalls of the openings 112a and 112b in the first cover layer 110, onto the exposed device area 104 of substrate 100, onto the remaining conductive layer 318, onto the surface 102 of substrate 100 in the exposed edge regions 320 and onto the outer sidewall 322 of the first cover layer 110. By analogy with the procedure of the first preferred embodiment of the invention, the filling material 118 is subsequently applied onto the deposited seed layer 116, the openings 112a and 112b in the first cover layer 110 being filled up, and the seed layer 116 deposited onto the surface 114 of the first cover layer 110 being covered. In addition, the filling material 118 is applied, at the same time, to seed layer 116, which covers the surface 102 of the substrate 100 in the edge regions 320 and in the outer sidewalls 322 of the first cover layer 110, such that a surface 120 of the filling material 118 results which is implemented in a flush manner. The structure resulting from this process step is illustrated in FIG. 3D.

Figure 3A:
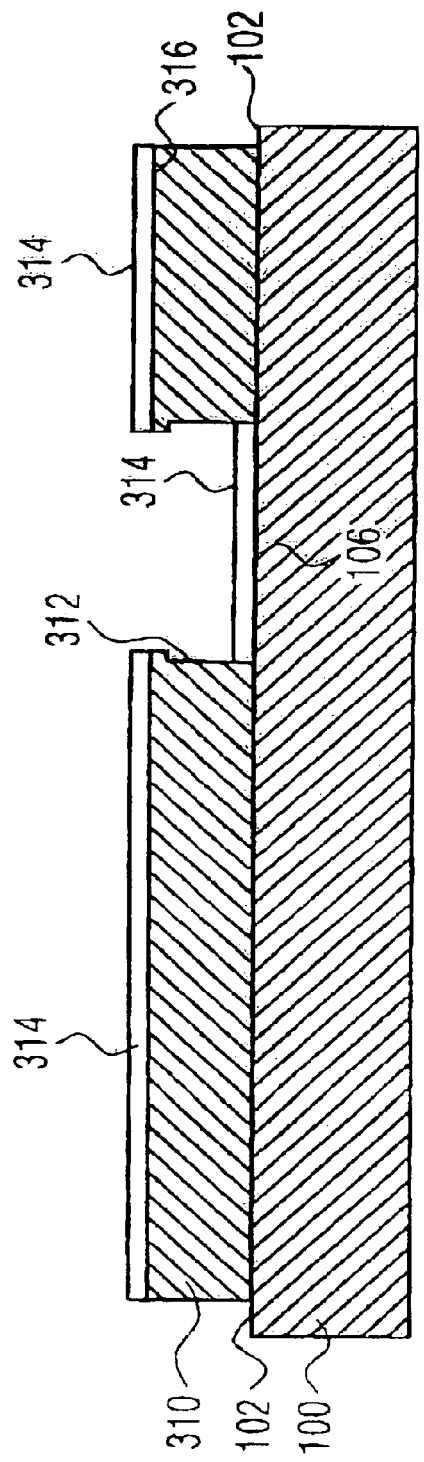
Figure 3B:
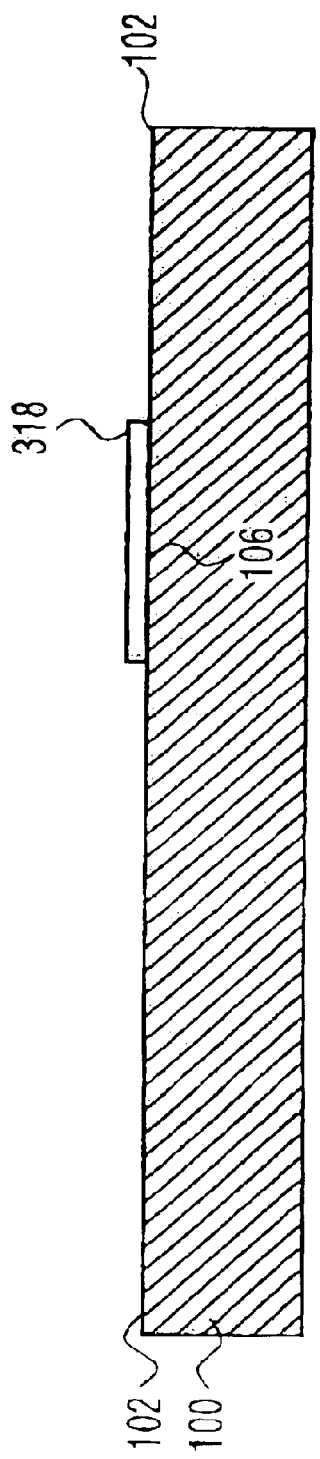
Figure 3E:
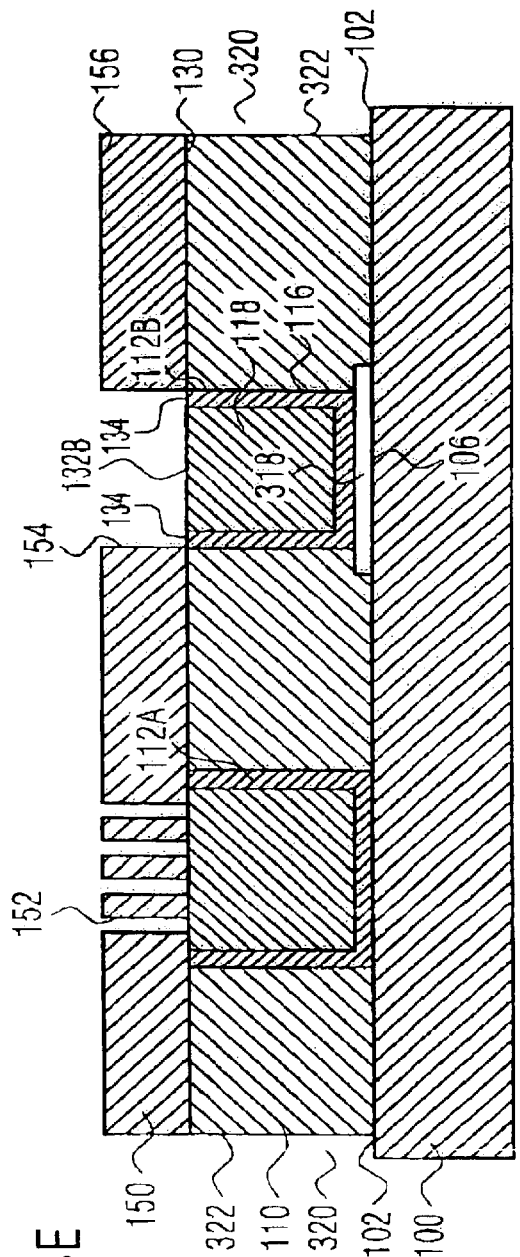

By analogy with the procedure of the first preferred embodiment of the invention, the surface 120 of the filling material 118, which surface results from the previous process steps of the second preferred embodiment of the invention, is subsequently planarized such that, in turn, the planar surface area 130 results, wherein areas of the first cover layer 110, of the seed layer 116 and of the filling material 118 are exposed, the transitions between the different areas being aligned in a flush manner. In addition, the outer sidewall 322 of the first cover layer 110, and the surface 102 of substrate 100 are exposed in the edge regions 320 of substrate 100 by removing the seed layer 116, which has been applied in these areas, and the filling material 118. Thereafter, by analogy with the procedure utilized in the first preferred embodiment of the invention, the second cover layer 150 is applied onto the planar surface area 130, which is followed by a structuring of the second cover layer 150, wherein the openings 152 are formed in the second cover layer 150. The structure resulting from the structuring of the second cover layer 150 is shown in FIG. 3E.

Figure 3F:
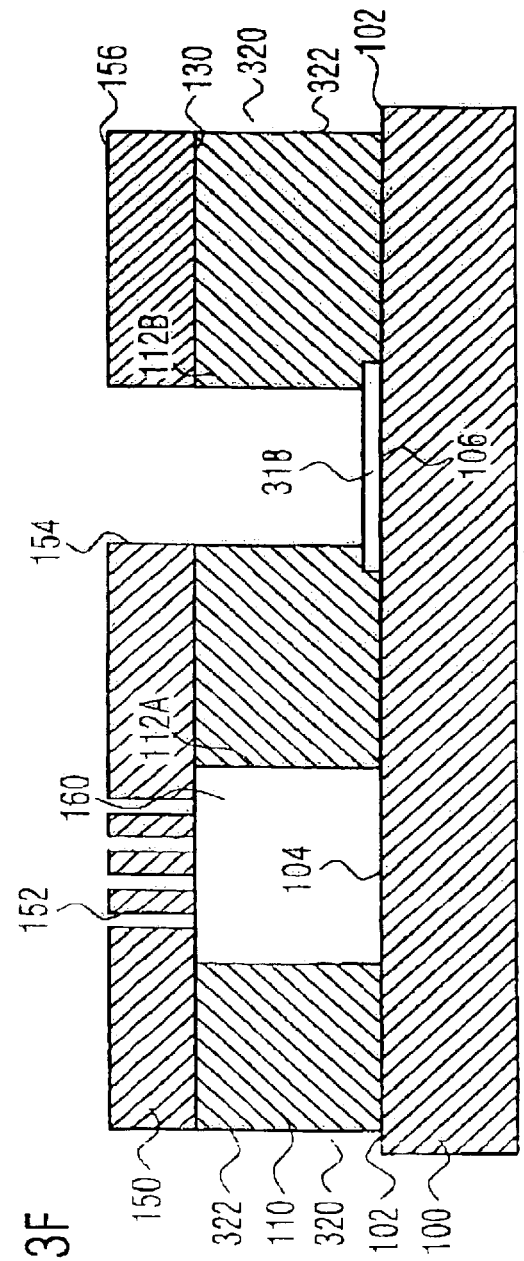

By analogy with the procedure used in the first preferred embodiment of the invention, in a subsequent process step, that filling material 118 which is accessible through the openings 152 and through the opening 154 in the second cover layer 150 is removed. Here, the seed layer 116, which surrounds the filling material 118 to be removed, is removed at the same time, whereby the cavity 160, which is required for the correct operation of the device, is formed. The structure resulting from this process step is shown in FIG. 3F.

For forming a convenient protective cover of the device, the cavity 160 resulting after the removal of the filling material 118 and of the seed layer 116 must be closed, by analogy with the procedure used in the first preferred embodiment of the invention. For this purpose, the third cover layer 170 is applied onto the surface 156 of the second cover layer 150, whereby the openings 152 in the second cover layer 150 are closed without filling up the cavity 160 formed. By structuring the third cover layer 170, the opening 172 in the third cover layer 170 is also formed to expose an area of the remaining conductive layer 318, the opening 172 being located above the opening 154 of the second cover layer 150. The structure resulting herefrom is shown in FIG. 3G.

In a subsequent process step, the opening 112b in the first cover layer 110, the opening 154 in the second cover layer 150, and the opening 172 in the third cover layer 170 are filled up with the conductive filling material 176 to be conductive, such that external contacting of the remaining conductive layer 318 from the surface 178 of the third cover layer 170 is made possible. Subsequently, the metal paste 174 is applied to those areas of the surface 178 of the third cover layer 170 which are provided for external contacting of the remaining conductive layer 318 via the conductive filling material 176. The structure obtained after this process step is shown in FIG. 3H.

After applying a reflow process, the metal paste 174 applied in the preceding process step forms the solder bumps required for the external contacting of the contact area 106. The structure resulting from this process step is represented in FIG. 3I.

In addition, dicing lines are marked, for example by the exposed edge regions 122 and/or 320, on wafer level, whereby the wafer may be diced into individual devices.

Even though preferred embodiments of the present invention have been explained in detail above, it is evident that the present invention is not limited to these embodiments. Application to other micromechanical devices is also possible, and the number of openings in the cover layers is also not limited to the number given in the figures. In addition, the contact area 106 described does not exclusively provide a contacting possibility for the adjacent device area 104; rather, a contacting area 106 may be used to implement a general contacting possibility for any element or any structure on the substrate.

Even though the present invention has been explained with reference to two preferred embodiments which comprise a cavity 160 to be formed above the device area 104 as well as, at the same time, contacting of the contact area 106 of a device, the invention also includes, in particular, embodiments wherein only the cavity 160 is formed above a device area 104, or wherein the contact area 106 of a device is contacted.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

List of Reference Numerals 100 substrate
102 surface of the substrate
104 device area
106 contact area
108 area comprising no contact area and no device area
110 first cover layer
112a opening of the first cover layer 110 above a device area 104
112b opening of the first cover layer 110 above a contact area 106
114 surface of the first cover layer 110
116 seed layer
118 filling material
120 surface of the filling material 118
122 edge regions of the substrate 100
130 planar surface area
132a surface of a filled-up opening 112a
132b surface of a filled-up opening 112b
134 plane of section of the seed layer 116
140 additional cover layer
142 opening of the additional cover layer 140
144 conductive layer
146 surface of the additional cover layer 140
148 remaining portion of the conductive layer 146
150 second cover layer
152 opening of the second cover layer 150 for exposing the filling material 118 in the device area 104
154 opening of the second cover layer 150 for exposing the remaining conductive layer 148
156 surface of the second cover layer 150
160 cavity
170 third cover layer
172 opening in the third cover layer 170
172a opening in the third cover layer 170
174 metal paste
176 conductive filling material
178 surface of the third cover layer
180 solder bump
310 initial cover layer
312 opening in the initial cover layer 310
314 conductive layer
316 surface of the initial cover layer 310
318 remaining conductive layer
320 edge region of the substrate 100
322 outer sidewall of the first cover layer 110

What is claimed is:

1. A method for producing a protective cover for a device, wherein a substrate is provided that includes the device, the method comprising:

(a) depositing a first cover layer on a substrate, the first cover layer covering at least an area of the substrate which includes the device;

(b) forming at least one opening in the first cover layer, the at least one opening exposing the area of the substrate which includes the device;

(c) filling up the opening formed in the first cover layer using a filling material;

(d) depositing a second cover layer on the first cover layer and on the opening of the first cover layer which is filled up with the filling material;

(e) forming at least one opening in the second cover layer to expose at least an area of the filling material;

(f) removing the filling material which covers an area of the substrate which includes the device; and (g) closing the opening formed in the second cover layer.

2. The method as claimed in claim 1, wherein step (c) includes:

(c.1) applying a filling material on the first cover layer and in the at least one opening of the first cover layer;

(c.2) planarizing the structure resulting from step (c.1) such that the first cover layer and the filling material in the at least one opening of the first cover layer are exposed and are aligned in a flush manner such that a planar surface area is formed.

3. The method as claimed in claim 1, wherein in step (b), a further opening is formed in the first cover layer to expose an area of the substrate having a contact area of a device, in step (c), the further opening is filled up with a conductive filling material, a conductive layer being deposited on the filled further opening prior to step (d), which layer is connected to the conductive filling material in the further opening in an electrically conductive manner and covers same;

in step (e), a further opening is formed in the second cover layer to expose the conductive layer;

in step (g), the further opening in the second cover layer remains non-closed.

4. The method as claimed in claim 1, wherein the substrate comprises a contact area of a device, a conductive layer which covers the contact area being applied prior to step (a), a further opening being formed in the first cover layer in step (b) to expose the conductive layer, the further opening being filled up with a filling material in step (c), a further opening being formed in the second cover layer in step (e), to expose the filling material in the further opening of the first cover layer, the filling material being removed from the further opening in the first cover layer in step (f), the further opening in the second cover layer remaining non-closed in step (g).

5. The method as claimed in claim 3, wherein after step (g), a conductive material is introduced into the further opening of the second cover layer to route the contact area of the device across the conductive layer and the conductive material to an external contact pad.

6. The method as claimed in claim 5, wherein the external contact pad is formed by structured application of a metal paste.

7. The method as claimed in claim 1, wherein the device is a BAW filter, SAW filter, a resonator, a sensor or an actor.

8. The method as claimed in claim 1, wherein the substrate is a wafer which includes a plurality of identical or different devices, wherein in step (a) and (b), the first cover layer is applied on the wafer and structured to at least create the at least one opening for each device, wherein in step (c), the openings formed in the first cover layer are filled up with the filling material, wherein in step (d) and (e), the second cover layer is applied on the first cover layer and in the filled-up openings of the first cover layer, and is structured to create at least one opening for each filled-up opening in the first cover layer which covers a device, wherein in step (f), the filling material is removed from the filled-up openings of the first cover layer, and wherein in step (g), the openings in the second cover layer are closed.

9. The method as claimed in claim 8, wherein the wafer is subsequently diced into individual elements.

10. The method as claimed in claim 8, wherein the structuring of the cover layer includes specifying dicing lines on the wafer.

11. A method for producing a protective cover for a device, wherein a substrate is provided that includes the device, the method comprising:

(a) depositing a first cover layer on a substrate, the first cover layer covering at least an area of the substrate which includes the device;

(b) forming at least one opening in the first cover layer, the at least one opening exposing the area of the substrate which includes the device;

(c) filling up the opening formed in the first cover layer using a filling material;

(d) depositing a second cover layer on the first cover layer and on the opening of the first cover layer which is filled up with the filling material; and (e) removing the filling material which covers an area of the substrate which includes the device.

12. The method as claimed in claim 11, further comprising, after step d), forming at least one opening in the second cover layer to expose at least a part of the filling material.

13. The method as claimed in claim 11, wherein step (e) further comprises removing the filling material through an opening in the second cover layer.

14. The method as claimed in claim 13, further comprising a step (f) of closing the opening in the second cover layer.

15. The method as claimed in claim 14, wherein step (c) includes:

(c.1) applying a filling material on the first cover layer and in the at least one opening of the first cover layer;

(c.2) planarizing the structure resulting from step (c.1) such that the first cover layer and the filling material in the at least one opening of the first cover layer are exposed and are aligned in a flush manner such that a planar surface area is formed.

16. The method as claimed in claim 11, wherein step (c) includes:

(c.1) applying a filling material on the first cover layer and in the at least one opening of the first cover layer;

(c.2) planarizing the structure resulting from step (c.1) such that the first cover layer and the filling material in the at least one opening of the first cover layer are exposed and are aligned in a flush manner such that a planar surface area is formed.

17. The method as claimed in claim 11, wherein the device is a BAW filter, SAW filter, a resonator, a sensor or an actor.

18. The method as claimed in claim 11, wherein the substrate is a wafer which includes a plurality of identical or different devices, wherein in step (a) and (b), the first cover layer is applied on the wafer and structured to at least create the at least one opening for each device, wherein in step (c), the openings formed in the first cover layer are filled up with the filling material, wherein in step (d), the second cover layer is applied on the first cover layer and in the filled-up openings of the first cover layer, and wherein in step (e), the filling material is removed from the filled-up openings of the first cover layer.

19. The method as claimed in claim 18, wherein the wafer is subsequently diced into individual elements.

20. The method as claimed in claim 18, wherein the structuring of the cover layer includes specifying dicing lines on the wafer.

* * * * *